United States Patent
Li

(10) Patent No.: US 11,373,911 B2
(45) Date of Patent: Jun. 28, 2022

(54) METHOD FOR FORMING FINS OF SEMICONDUCTOR DEVICE

(71) Applicant: SHANGHAI HUALI INTEGRATED CIRCUIT CORPORATION, Shanghai (CN)

(72) Inventor: Yong Li, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 17/148,453

(22) Filed: Jan. 13, 2021

(65) Prior Publication Data
US 2022/0122889 A1    Apr. 21, 2022

(30) Foreign Application Priority Data

Oct. 19, 2020  (CN) .......................... 202011119100.8

(51) Int. Cl.
*H01L 21/8234* (2006.01)
*H01L 27/092* (2006.01)
*H01L 21/768* (2006.01)

(52) U.S. Cl.
CPC .. *H01L 21/823431* (2013.01); *H01L 27/0924* (2013.01)

(58) Field of Classification Search
CPC ......... H01L 21/823431; H01L 21/7681; H01L 21/76811; H01L 27/0924; G03F 7/12
See application file for complete search history.

(56) References Cited

U.S. PATENT DOCUMENTS

| 2016/0314983 | A1* | 10/2016 | Han | .................... H01L 21/3081 |
| 2019/0064658 | A1* | 2/2019 | Chen | ................... H01L 21/0274 |
| 2021/0202321 | A1* | 7/2021 | Yang | ............... H01L 21/823431 |
| 2021/0210679 | A1* | 7/2021 | Liu | .......................... H01L 43/02 |

* cited by examiner

*Primary Examiner* — Christine A Enad
(74) *Attorney, Agent, or Firm* — Alston & Bird LLP

(57) ABSTRACT

A method for forming fins of Fin FETs is provided. A patterning process on the second sidewalls forms a type-one second sidewalls and a type-two second sidewalls, the type-one second sidewalls are arranged next to each other and sandwiched between a pair of type-two second sidewalls on one side and another pair of type-two second sidewalls on another side, followed by an etching to remove the pairs of the type-two second sidewalls from both sides of the type-one second sidewall. The type-two second sidewalls adjacent to the two sides of the type-one second sidewalls are not pattern-transferred to a to-be-patterned layer, after the fin patterns on the to-be-patterned layer are formed, patterns corresponding to the type-two second sidewalls are etched away through a rough removal process.

10 Claims, 11 Drawing Sheets

METHOD FOR FORMING FINS OF SEMICONDUCTOR DEVICE

CROSS-REFERENCES TO RELATED APPLICATIONS

This application claims priority to Chinese patent application No. CN 202011119100.8 filed at CNIPA on Oct. 19, 2020, and entitled "METHOD FOR FORMING FINS OF SEMICONDUCTOR DEVICE", the disclosure of which is incorporated herein by reference in entirety.

TECHNICAL FIELD

The present application relates to the field of semiconductor integrated circuits, in particular, to a method for forming fins of a semiconductor device.

BACKGROUND

In the field of semiconductor integrated circuits, the critical dimensions of semiconductor devices have been reduced continuously with the development of technologies, and the requirements on the manufacturing technology of semiconductor devices have become ever stricter. In order to increase the integration density of semiconductor devices, many different methods have been used with the existing technologies, such as the Self-Aligned Quadruple Patterning (SAQP) process. Devices at smaller nodes can be fabricated by adopting the SAQP process, and it has been proven that applying the SAQP process can realize smaller process fluctuation. As the technology continuously develops, the SAQP process has enabled less than 40 nm fin spacings.

A typical SAQP process includes the following steps: firstly forming first mandrels; then forming sidewalls covering the first mandrels, and forming second mandrels by using the sidewalls of the first mandrels as a mask; then forming sidewalls covering the second mandrels, and forming fins by using the sidewalls of the second mandrels as a mask. The fins formed by adopting the SAQP process are dense and the fin spacing can be less than 40 nm. When a device such as an SRAM is formed, etching is needed to increase the fin spacing. However, the minimum distance between two masked patterns is 80 nm. When the fin spacing is less than 40 nm and additional etching takes place in a spaced manner, under the condition that applying only one mask, the distance between two masked patterns is less than 80 nm, the desired result cannot be achieved. Thus two masks have to be applied, making the process more complex and more costly.

BRIEF SUMMARY OF THE DISCLOSURE

According to some embodiments in this application, a method for forming fins of a semiconductor device, comprising: a plurality of steps:
S1: providing a semiconductor substrate, comprising a stack of layers sequentially superimposed, wherein the stack of layers comprises, a to-be-patterned layer, a fin hard mask layer, a first mandrel layer and a second mandrel layer, a first etch stop layer being formed between the first mandrel layer and the second mandrel layer, a second etch stop layer being formed between the first mandrel layer and the fin hard mask layer, and a pad oxide layer being formed between the fin hard mask layer and the to-be-patterned layer;

S2: etching the second mandrel layer to form a plurality of second mandrels with a predetermined spacing therebetween;
S3: forming first sidewalls on both sides of each of the plurality of second mandrels;
S4: removing the plurality of second mandrels and keeping the first sidewalls under protection of the first etch stop layer;
S5: etching the first etch stop layer and the first mandrel layer under protection of the second etch stop layer and the first sidewalls, wherein the first sidewalls pattern a plurality of first mandrels;
S6: removing the first sidewalls and forming second sidewalls, wherein the second sidewalls cover both sides of each of the plurality first mandrels;
S7: removing the plurality of first mandrels and keeping the second sidewalls;
S8: performing a photolithograph process on the second sidewalls to form a type-one second sidewalls and a type-two second sidewalls, wherein two pairs of the type-one second sidewalls are arranged next to each other and sandwiched between a pair of the type-two second sidewalls on one side and another pair of the type-two second sidewalls on another side, followed by an etching process to remove the pairs of the type-two second sidewalls from both sides the type-one second sidewall;
S9: removing photoresist left by the photolithography process in S8;
S10: performing an etching process to expose the to-be-patterned layer to form patterns on the to-be-patterned layer under protection of remaining type-two second sidewalls and type-one second sidewalls;
S11: removing the remaining type-two and type-one second sidewalls, performing a photolithography process on the to-be-patterned layer to protect a first part of said patterns corresponding to the type-one second sidewalls but not protect a second part of said patterns corresponding to the type-two second sidewalls, followed by an etching process to remove the second etch stop layer, the fin hard mask layer, the pad oxide layer and the second part of said patterns;
S12: removing photoresist in the photolithography process in S11;
S13: performing an thermal annealing process on an oxide layer disposes on the first part of said patterns and then performing a planarization process above the fin hard mask layer; and
S14: removing the fin hard mask layer and the pad oxide layer on the first part of the patterns, and removing a part of the oxide layer to expose the first part of the patterns to form fins.

In some examples, in S2, a photolithography pattern is formed above the second mandrel layer, and wherein the first mandrel layer is etched by using the photolithography pattern as a mask to form the plurality of second mandrels.

In some examples, in S3, a first sidewall material layer is deposited on the plurality of second mandrels; and wherein the first sidewall material layer is etched back to form the first sidewalls.

In some examples, in S6, a second sidewall material layer is deposited on the plurality of first mandrels; and wherein the second sidewall material layer is etched back to form the second sidewalls.

In some examples, in S8, two pairs of the type-two second sidewalls on each side of the type-two second sidewalls are removed.

In some examples, in S14, the oxide layer at a bottom of the fins forms an isolating layer between two of the fins.

In some examples, a thickness of remaining part of the oxide layer in S14 is greater than a height of the patterns developed in S9.

In some examples, the to-be-patterned layer comprises one of silicon single crystal, germanium single crystal, and silicon germanium crystal.

In some examples, a spacing between any two adjacent ones of the plurality of second mandrels is equal.

In some examples, in S10, a wet etching process is performed by using the remaining type-two second sidewalls and the type-one second sidewalls as a mask to form the patterns corresponding to the remaining type-two second sidewalls and the type-one second sidewalls.

DETAILED DESCRIPTION OF THE APPLICATION

Figure 1A:
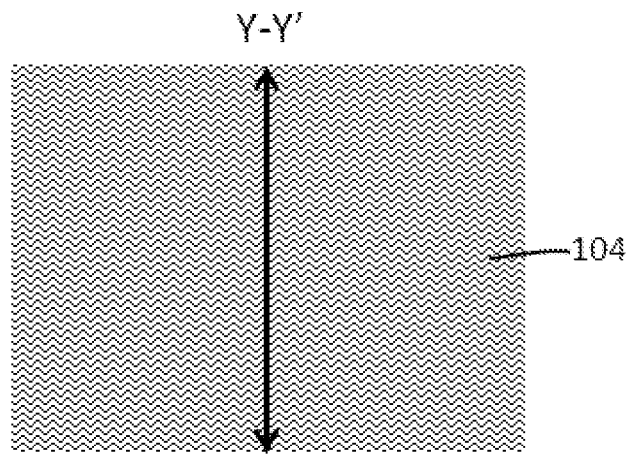
FIGS. 1a, 2a, 3a, 4a, . . . to 14a are schematic top views of structures following each step in a process of forming fins in a semiconductor device according to one embodiment of the present application.

The technical solution of the present application will be described below clearly and completely with reference to the drawings. Apparently, the described embodiments are partial embodiments of the present application, instead of all embodiments. Based on the embodiments of the present application, all other embodiments obtained by those skilled in the art without contributing any inventive labor shall fall into the scope of protection of the present application.

It should be understood that the present application may be implemented in different modes and should not be interpreted as limited to the embodiments presented herein. On the contrary, the provision of these embodiments will make the disclosure complete and complete, and fully convey the scope of the present application to those skilled in the art. In the drawings, for the purpose of clarity, the dimensions and relative dimensions of the layers and regions may be exaggerated, and the same reference signs represent the same components throughout. It should be understood that when a component or layer is referred to as "on . . . ", "adjacent to . . . ", "connected to" or "coupled to" any other component or layer, it may be directly on, adjacent to, connected to or coupled to any other element or layer, or there may be an intermediate component or layer. On the contrary, when a component is referred to as "directly on . . . ", "directly adjacent to . . . ", "directly connected to", or "directly coupled to" any other component or layer, there is no intermediate component or layer. It should be understood that although the terms such as first, second and third may be used to describe various elements, components, regions, layers and/or parts, these components, elements, regions, layers and/or parts should not be limited by these terms. These terms are used only to distinguish one component, element, region, layer or part from another. Therefore, without departing from the teaching of the present application, a first component, element, region, layer or part discussed below may be represented as a second component, element, region, layer or part.

Spatial relationship terms such as "beneath . . . ", "under . . . ", "lower", "below . . . ", "above . . . " and "upper" may be used here for convenience of description, so as to describe a relationship between one component or feature illustrated in the drawings and any other component or feature. It should be understood that, in addition to the orientations illustrated in the drawings, the spatial relationship terms are intended to also include different orientations of devices in use and operation. For example, if a device in the drawing is turned over, the component or feature described as "below any other component" or "under any other component" or "below any other component" will be oriented to be "above" any other component or feature. Therefore, the exemplary term "below . . . " and "beneath" may include orientations "above" and "below". The device may be otherwise oriented (rotated for 90 degrees or oriented in other directions) and the spatial description terms used herein are interpreted accordingly.

The terms used herein are intended only to describe the specific embodiments rather than to limit the present application. When used herein, singular forms "a", "one" and "said/the" are also intended to include plural forms, unless otherwise clearly indicated in the context. It should also be understood that the terms "consist of" and/or "include", when used in the description, determine the existence of said feature, integer, step, operation, component and/or element, but do not exclude the existence or addition of one or more other features, integers, steps, operations, components, elements and/or groups. As used herein, the term "and/or" includes any and all combinations of the items listed.

One embodiment of the present application provides a method for forming fins of a semiconductor device, which includes: S1: providing a semiconductor substrate, comprising a stack of layers sequentially superimposed, wherein the stack of layers comprises a to-be-patterned layer, a fin hard mask layer, a first mandrel layer and a second mandrel layer, a first etch stop layer being formed between the first mandrel layer and the second mandrel layer, a second etch stop layer being formed between the first mandrel layer and the fin hard mask layer, and a pad oxide layer being formed between the fin hard mask layer and the to-be-patterned layer; S2: etching the second mandrel layer to form a plurality of second mandrels with a predetermined spacing therebetween; S3: forming first sidewalls on both sides of each of the plurality of second mandrels; S4: removing the plurality of second mandrels and keeping the first sidewalls under protection of the first etch stop layer; S5: etching the first etch stop layer and the first mandrel layer under protection of the second etch stop layer and the first sidewalls, wherein the first sidewalls pattern a plurality of first mandrels; S6: removing the first sidewalls and forming second sidewalls, wherein the second sidewalls cover both sides of each of the plurality first mandrels; S7: removing the plurality of first mandrels and keeping the second sidewalls; S8: performing a photolithograph process on the second sidewalls to form a type-one second sidewalls and a type-two second sidewalls, wherein two pairs of the type-one second sidewalls are arranged next to each other and sandwiched between a pair of the type-two second sidewalls on one side and another pair of the type-two second sidewalls on another side, followed by an etching process to remove the pairs of the type-two second sidewalls from both sides the type-one second sidewall; S9: removing photoresist left by the photolithography process in S8; S10: performing an etching process to expose the to-be-patterned layer to form patterns on the to-be-patterned layer under protection of remaining type-two second sidewalls and type-one second sidewalls;

S11: removing the remaining type-two and type-one second sidewalls, performing a photolithography process on the to-be-patterned layer to protect a first part of said patterns corresponding to the type-one second sidewalls but not protect a second part of said patterns corresponding to the type-two second sidewalls, followed by an etching process to remove the second etch stop layer, the fin hard mask layer, the pad oxide layer and the second part of said patterns; S12: removing photoresist in the photolithography process in S11; S13: performing an thermal annealing process on an oxide layer disposes on the first part of said patterns and then performing a planarization process above the fin hard mask layer; and S14: removing the fin hard mask layer and the pad oxide layer on the first part of the patterns, and removing a part of the oxide layer to expose the first part of the patterns to form fins.

Figure 1B:
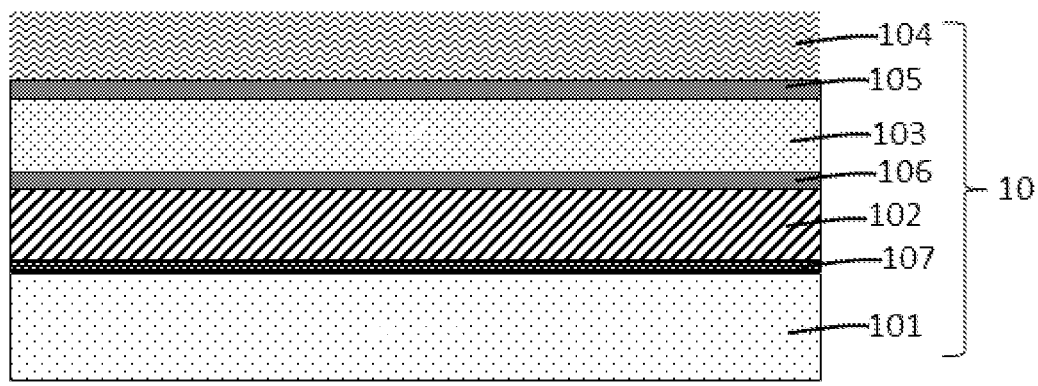
FIGS. 1b, 2b, 3b, 4b, . . . to 14b are schematic cross sectional views of structures along a cut-line Y-Y' in FIGS. 1a, 2a, 3a, 4a, . . . to 14a respectively in the process.
Figure 2A:
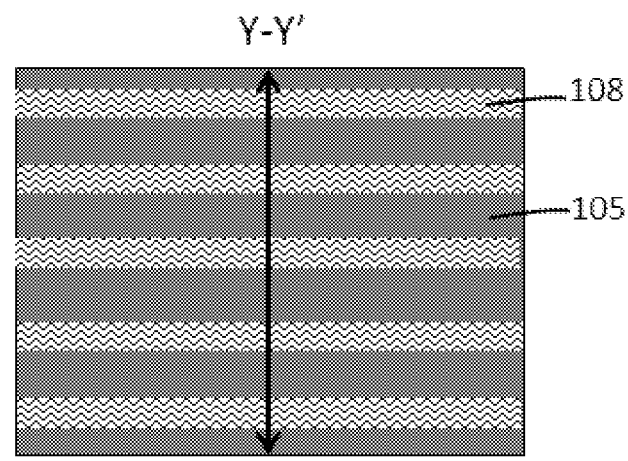
Figure 2B:
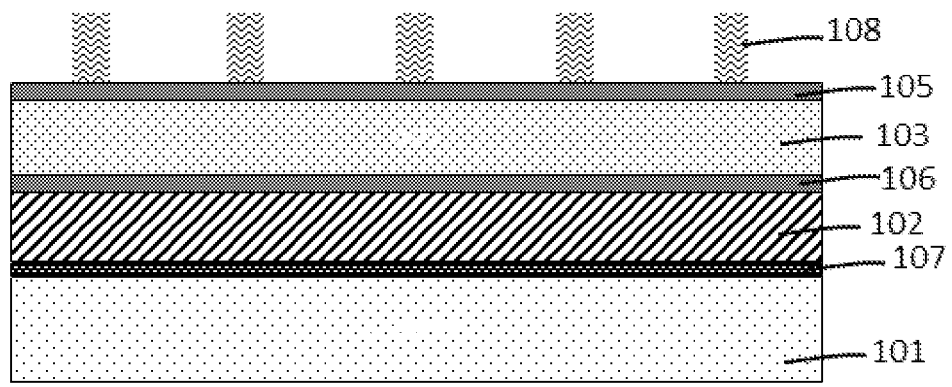
Figure 3A:
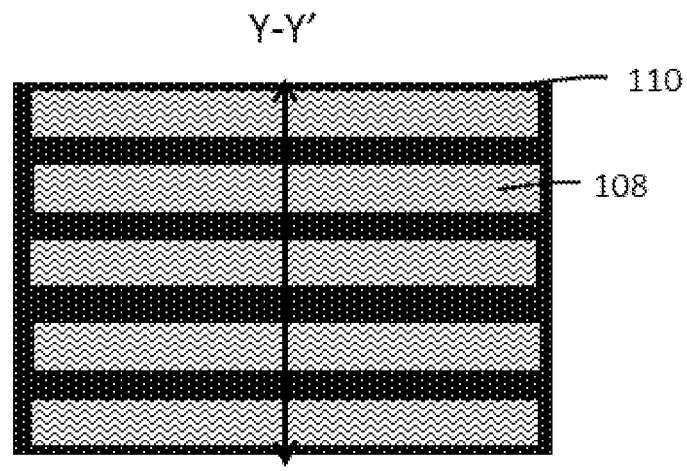
Figure 3B:
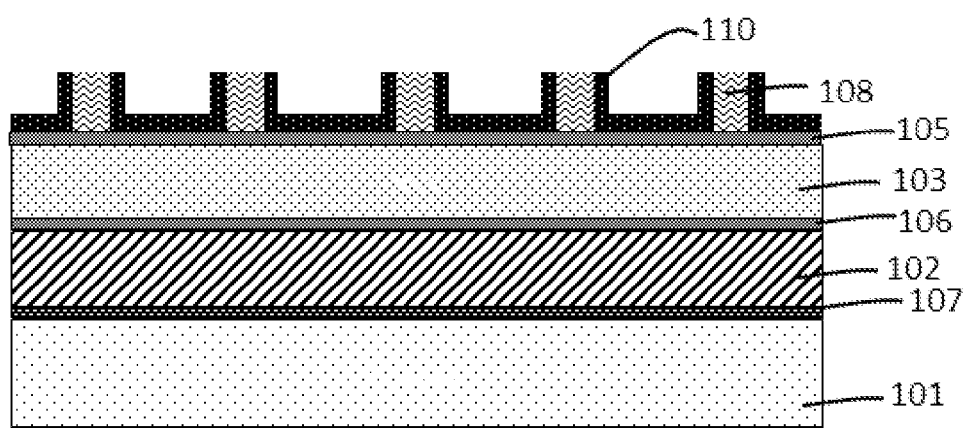

Specifically, please refer to FIGS. 1a, 2a, 3a, . . . to 14a are schematic top views of structures after each step in a process of forming fins of a semiconductor device according to one embodiment of the present application. FIGS. 1b, 2b, 3b, . . . to 14b are schematic cross sectional views of structures along the cut-line Y-Y' in FIGS. 1a to 14a respectively in the process of forming fins. FIGS. 8c, 9c, 10c, . . . to 14c. FIG. 8c to FIG. 14c are schematic cross sectional views of structures along the cut-line X-X' in FIGS. 8a to 14a respectively in the process of forming fins. The method for forming the fins of the semiconductor device according to one embodiment of the present application includes the following steps:

In S1, referring to FIG. 1a and FIG. 1b, a semiconductor substrate 10 is provided, the semiconductor substrate 10 includes a to-be-patterned layer 101, a fin hard mask (Fin HM) layer 102, a first mandrel layer 103 and a second mandrel layer 104, which are sequentially superimposed, a first etch stop layer (ESL) 105 is formed between the first mandrel layer 103 and the second mandrel layer 104, a second etch stop layer 106 is formed between the first mandrel layer 103 and the fin hard mask layer 102, and a pad oxide (PO) layer 107 is formed between the fin hard mask layer 102 and the to-be-patterned layer 101.

Specifically, in one embodiment, the to-be-patterned layer 101 comprises one of silicon single crystal, germanium single crystal or silicon-germanium crystal. Alternatively, the to-be-patterned layer 101 may be a silicon-on-insulator (SOI) substrate, superimposed silicon-on-insulator (SSOI), superimposed silicon-germanium-on-insulator (S-SiGeOI), silicon germanium-on-insulator (SiGeOI), germanium-on-insulator (GeOI), a substrate with an epitaxial layer structure on silicon, or a compound semiconductor. The compound semiconductor can be one or a compound of silicon carbide, gallium arsenide, gallium phosphide, indium phosphide, indium arsenide, or indium dysproside. According to one exemplary embodiment, the to-be-patterned layer 101 is a silicon single crystal. The pad oxide layer 107 is silicon dioxide (SiO2). The fin hard mask layer 102 may be one or a combinations of titanium nitride (TIN), tantalum nitride (tan), silicon carbide (SIC) and titanium oxide (TiO2). The pad oxide layer and the fin hard mask layer are used to protect the fins. The first etch stop layer 105 and the second etch stop layer 106 may be silicon nitride, carbon-containing silicon nitride (NDC), or silicon dioxide. The first etch stop layer 105 and the second etch stop layer 106 are used to prevent over-etching. The first mandrel layer 103 and the second mandrel layer 104 may be spin on carbon (SOC), spin-on-hard (SOH), amorphous silicon or amorphous carbon, etc. The materials of the first mandrel layer 103 and the second mandrel layer 104 may be the same or different.

In S2, referring to FIG. 2a and FIG. 2b, the second mandrel layer 104 is etched to form a plurality of second mandrels 108 with a predetermined spacing therebetween.

Specifically, a photolithography pattern is formed above the second mandrel layer 104, and the first mandrel layer 104 is etched by using the photolithography pattern as a mask to form a plurality of second mandrels 108. Specifically, there is a predetermined spacing between the second mandrels 108. Alternatively, the spacing between the second mandrels 108 is equal.

In S3, referring to FIG. 3a and FIG. 3b, first sidewalls 110 are formed on both sides of each of the second mandrels 108.

Specifically, a first sidewall material layer covering the second mandrels 108 is deposited; the first sidewall material layer is etched back to form the first sidewalls 110. In one exemplary implementation mode, the sidewall material may be silicon nitride. A method for forming the sidewall material layer may be, for example, the chemical vapor deposition (CVD). Alternatively, the etching-back method may be an anisotropic etching. Alternatively, plasma enhanced chemical vapor deposition (PECVD) may be adopted.

Figure 4A:
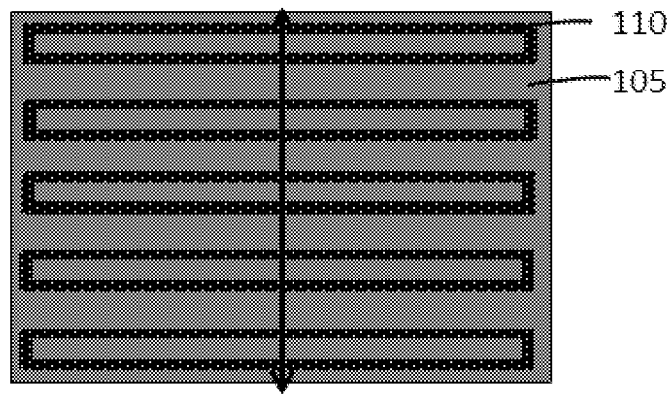
Figure 4B:
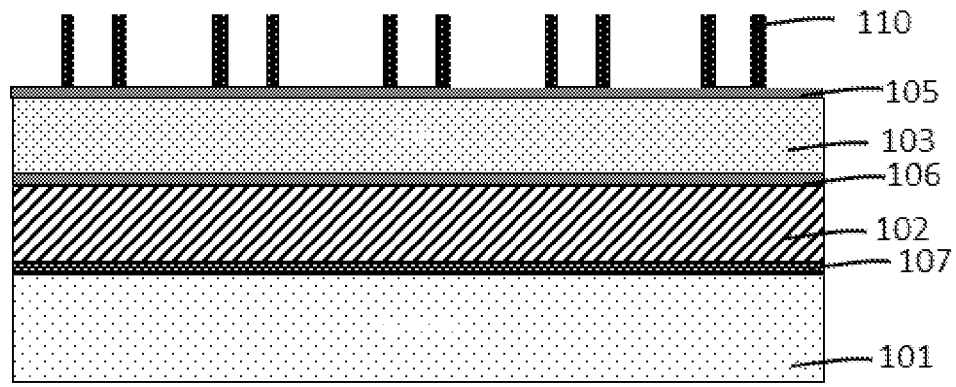

In S4, referring to FIG. 4a and FIG. 4b, the second mandrels 108 are removed and the first sidewalls 110 are reserved by using the first etch stop layer 105 as an etch stop layer.

Alternatively, the second mandrels 108 may be removed by adopting a wet strip (WS) method.

Figure 5A:
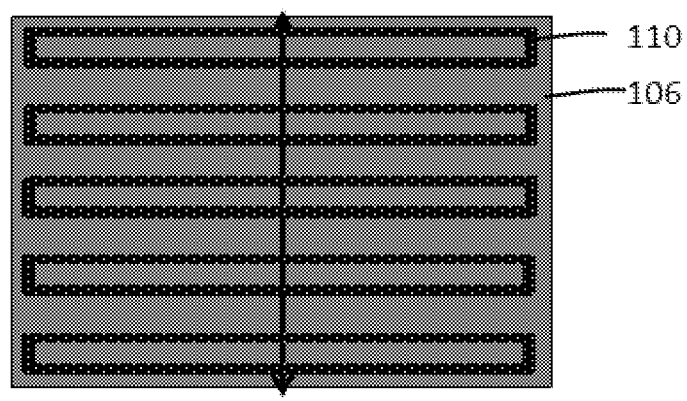
Figure 5B:
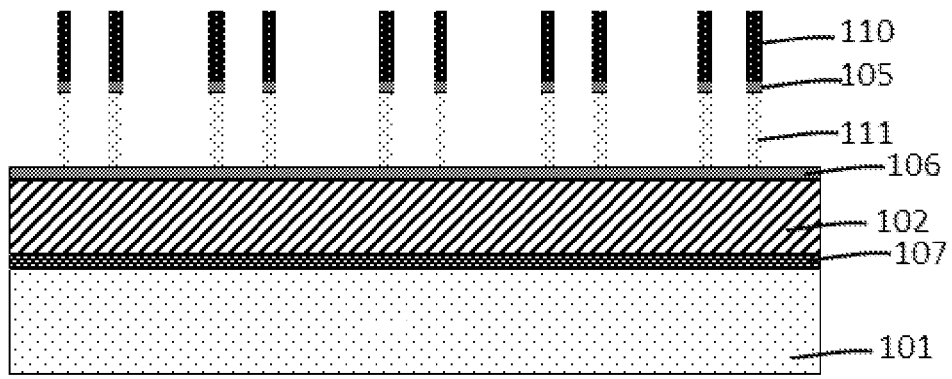

In S5, referring to FIG. 5a and FIG. 5b, the first etch stop layer 105 and the first mandrel layer 103 are etched by using the second etch stop layer 106 as a stop layer and the first sidewalls 110 as a mask to form a plurality of first mandrels 111.

Specifically, the first mandrel layer 103 may be etched by adopting a wet etching process. After etching, the width of the first mandrels 111 is substantially the same as the width of the first sidewalls 110.

Figure 6A:
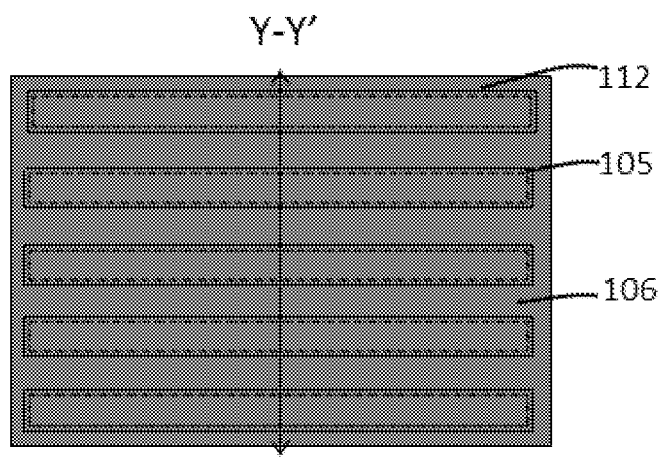
Figure 6B:
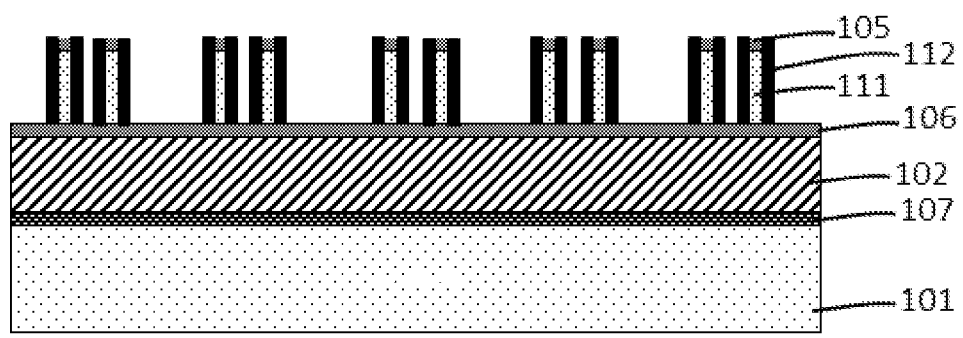

In S6, referring to FIG. 6a and FIG. 6b, the first sidewalls 110 are removed and second sidewalls 112 are formed which cover both sides of each of the first mandrels 111.

Specifically, a second sidewall material layer is deposited to cover the first mandrels 111 layer, and the second sidewall material layer is etched back to form the second sidewalls 112. Specifically, the material of the second sidewalls 112 may be silicon nitride.

Figure 7A:
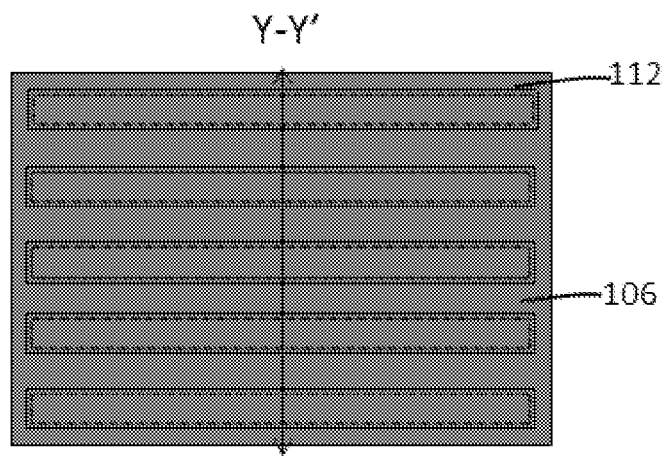
Figure 7B:
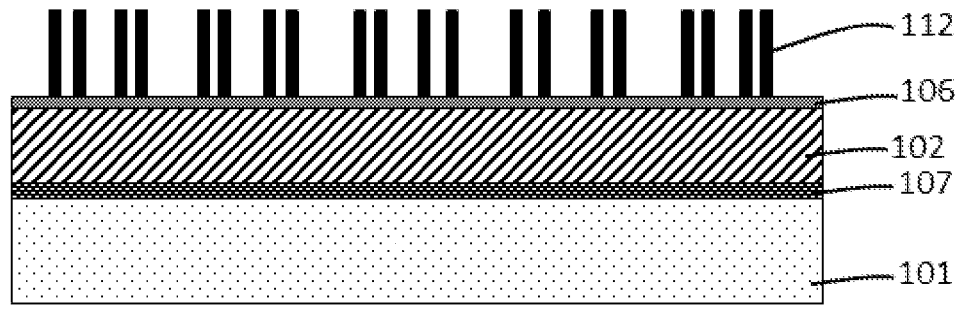

In S7, referring to FIG. 7a and FIG. 7b, the first mandrels 111 are removed and the second sidewalls 112 remain.

Alternatively, the first mandrels 111 may be removed by adopting a wet strip (WS) method.

Figure 8A:
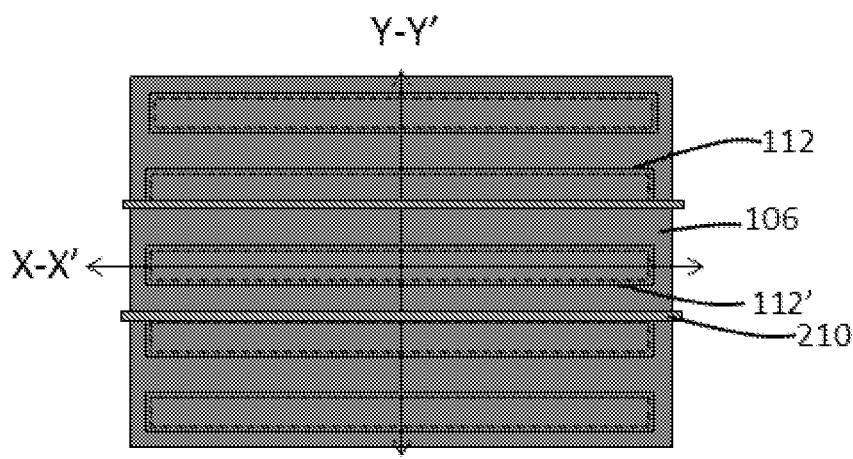
FIGS. 8c, 9c, 10c, 11c, . . . to 14c are schematic cross sectional views of structures along the cut-line X-X' in FIGS. 8a, 9c, 10c, 11c, . . . to 14a respectively in the process.
Figure 8B:
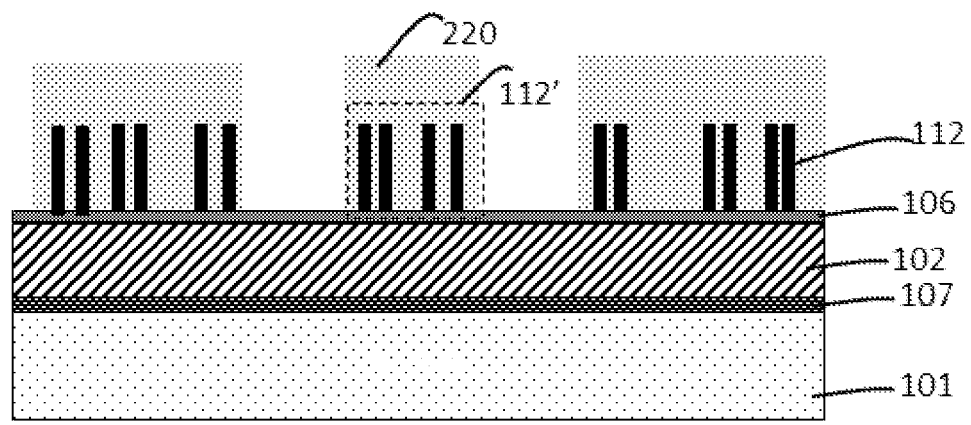
Figure 8C:
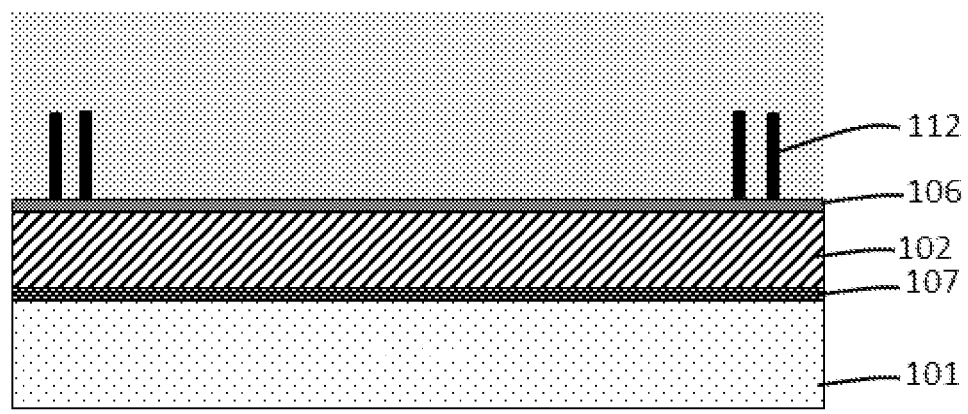

In S8, referring to FIG. 8a and FIG. 8b, a photoresist layer is formed, exposure and development of the photoresist are performed to develop at least one second sidewall 112 adjacent to both sides of type-one second sidewalls 112' to protect the type-one second sidewalls 112' and other second sidewalls 112 by using photoresist, and an etching process is performed after to remove the at least one second sidewall 112 which has been developed.

Referring to FIG. 8a and FIG. 8b, there are four type-one second sidewalls 112', and two second sidewalls 112 located in a region 210 adjacent to the two sides of the type-one second sidewalls 112' are removed. Referring to FIG. 8a and FIG. 8b, two second sidewalls are removed. Of course, one second sidewall 112 may be removed. Referring to FIG. 8a and FIG. 8b, there are four type-one second sidewalls 112'. Of course, the number of the type-one second sidewalls 112' is not limited in the present application. Generally, this process is called as a fine removal process or a horizontal removal process.

In addition, refer to FIG. 8c, which is a schematic cross sectional view of a structure along the cut-line X-X' in FIG. 8a in the process of forming fins of the semiconductor device according to one embodiment of the present application. Referring to FIG. 8c, in the direction X-X', the two sides include two second sidewalls 112.

Figure 9A:
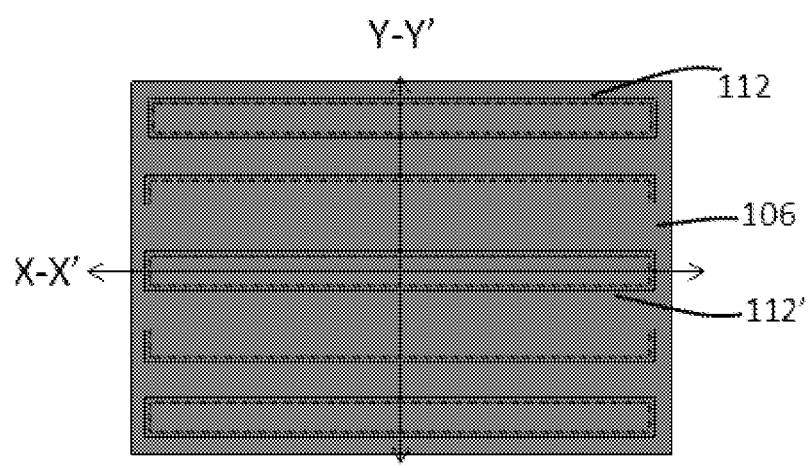
Figure 9B:
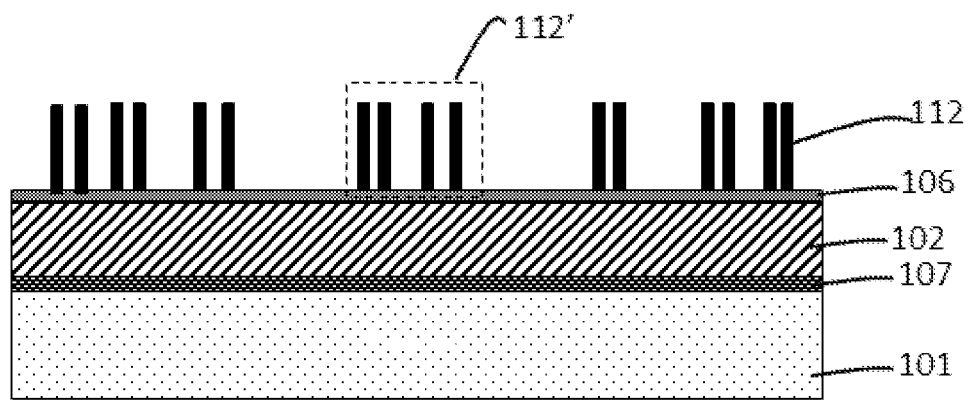
Figure 9C:
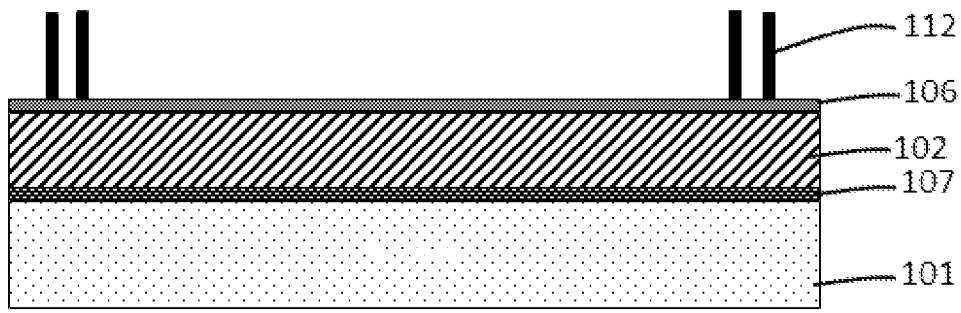

In S9, referring to FIG. 9a and FIG. 9b, the photoresist is removed.

Additionally, refer to FIG. 9c, which is a schematic cross sectional view of a structure along the cut line X-X' in FIG. 9a in the process of forming fins of the semiconductor device according to one embodiment of the present application.

Figure 10A:
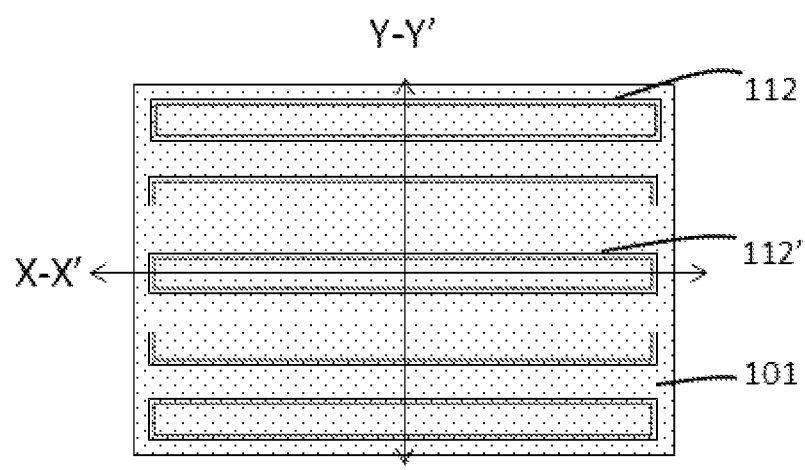
Figure 10B:
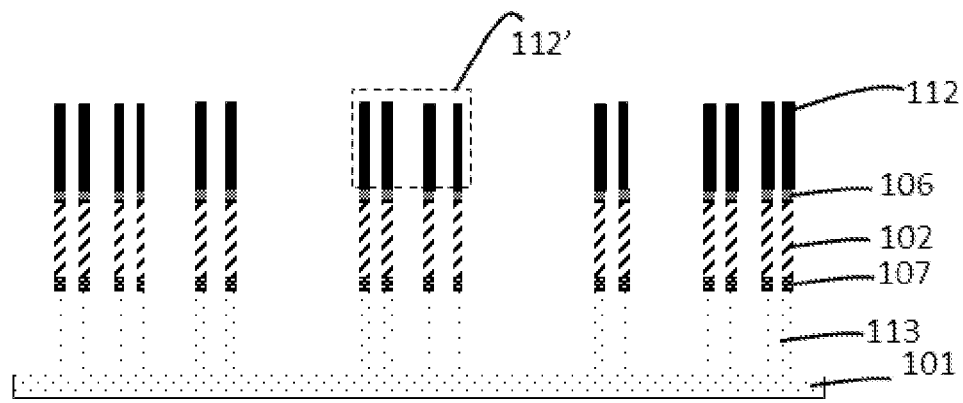
Figure 10C:

In S10, referring to FIG. 10a and FIG. 10b, etching is performed till the to-be-patterned layer 101 is exposed by using the remaining second sidewalls 112 and the type-one second sidewalls 112' as the mask to form patterns 113 on the to-be-patterned layer 101.

Specifically, the second etch stop layer 106, the fin hard mask layer 102, the pad oxide layer 107 and the to-be-patterned layer 101 are etched by using the remaining second side walls 112 and the type-one second sidewall 112' as a mask to form patterns 113 on the to-be-patterned layer 101.

Specifically, a wet etching process is performed by using the remaining second sidewalls 112 and the type-one second sidewalls 112' as a mask to form patterns 113 corresponding to the remaining second sidewalls 112 and the type-one second sidewalls 112'.

Continue to refer to FIG. 10c, which is a schematic cross sectional view of the structure along the cut-line X-X' in FIG. 10a in the process of forming fins.

Figure 11A:
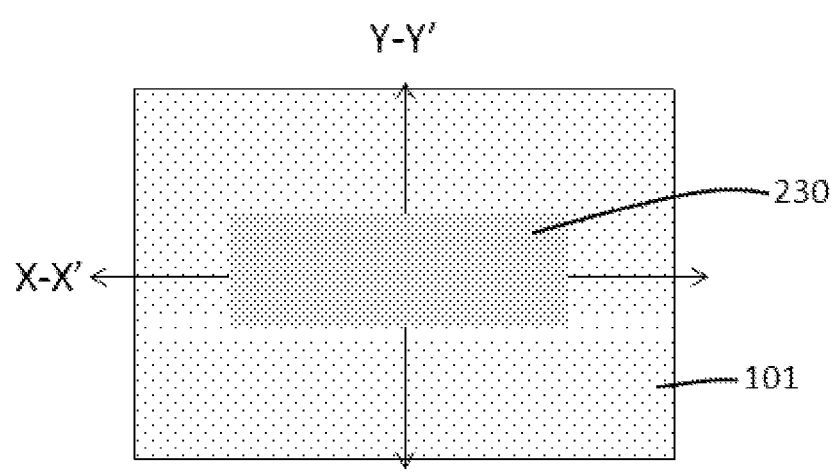
Figure 11B:
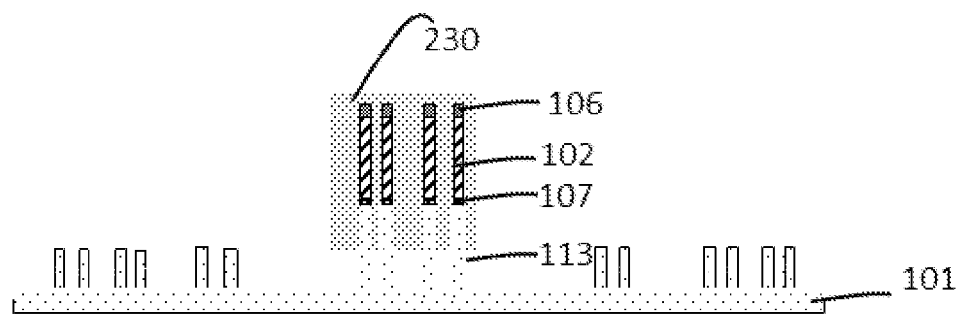

In S11, referring to FIG. 11a and FIG. 11b, the remaining second sidewalls 112 and the type-one second sidewalls 112' are removed, a photoresist layer is formed, exposure and development are performed to protect the patterns 113 corresponding to the type-one second sidewalls 112' by using photoresist 230 and develop the patterns corresponding to the other second sidewalls 112, and an etching process is performed to etch away the second etch stop layer 106, the fin hard mask layer 102, the pad oxide layer 107 and the patterns 113 which have been developed.

Specifically, an etching process is adopted to remove the remaining second sidewalls 112 and the type-one second sidewalls 112'.

Generally, this process is called as a rough removal process.

Figure 11C:

Continue referring to FIG. 11c, which is a schematic cross sectional view of a structure along the cut-line X-X' in FIG. 11a in the process of forming fins.

Figure 12A:
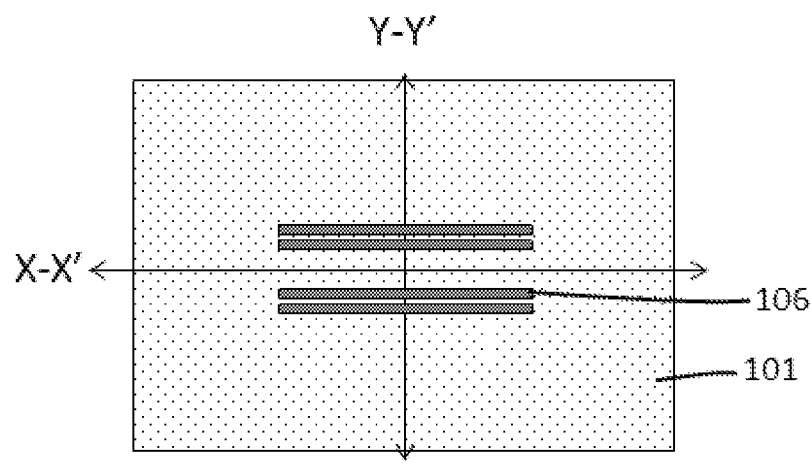
Figure 12B:
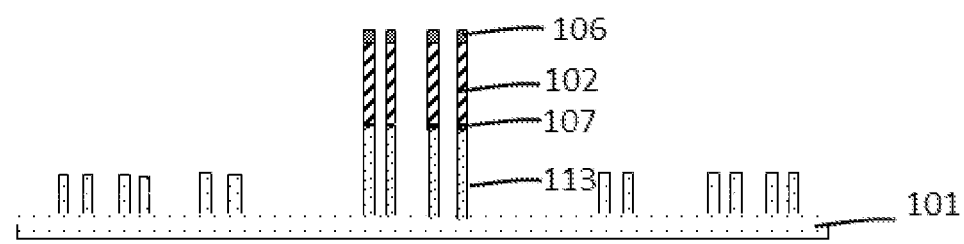

In S12, referring to FIG. 12a and FIG. 12b, the photoresist 230 is removed.

Figure 12C:

Continue referring to FIG. 12c, which is a schematic cross sectional view of a structure cut along the line X-X' in FIG. 12a in the process of forming the fins.

Figure 13A:
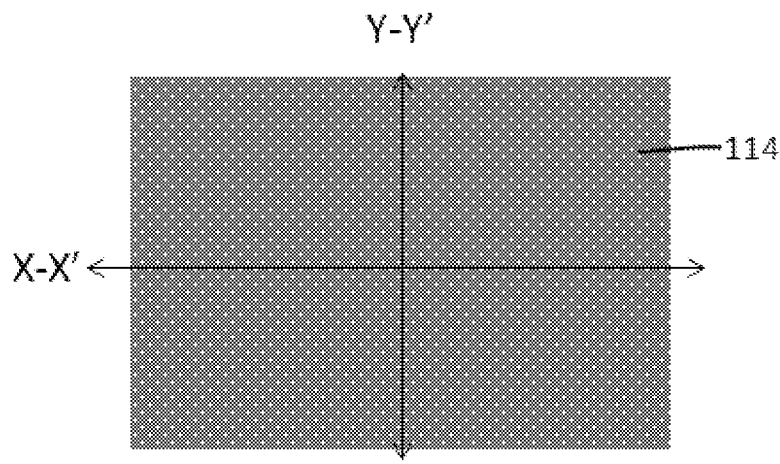
Figure 13B:
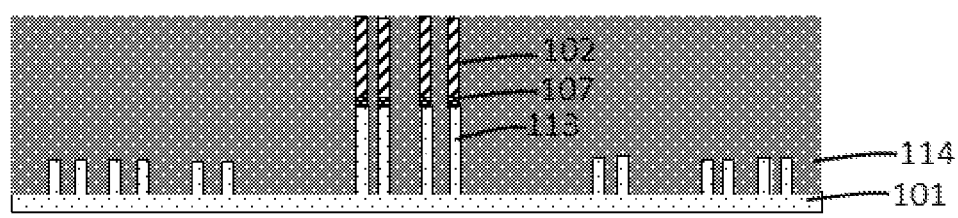

In S13, referring to FIG. 13a and FIG. 13b, an oxide layer 114 is formed, an thermal annealing process is performed, followed by a planarization process by using the fin hard mask layer 102 as a stop layer.

Figure 13C:
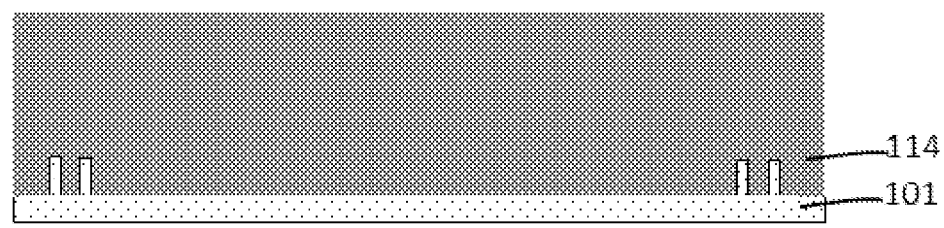

Continue to refer to FIG. 13c, which is a schematic cross sectional view of a structure cut along the line X-X' in FIG. 13a in the process of forming fins.

Figure 14A:
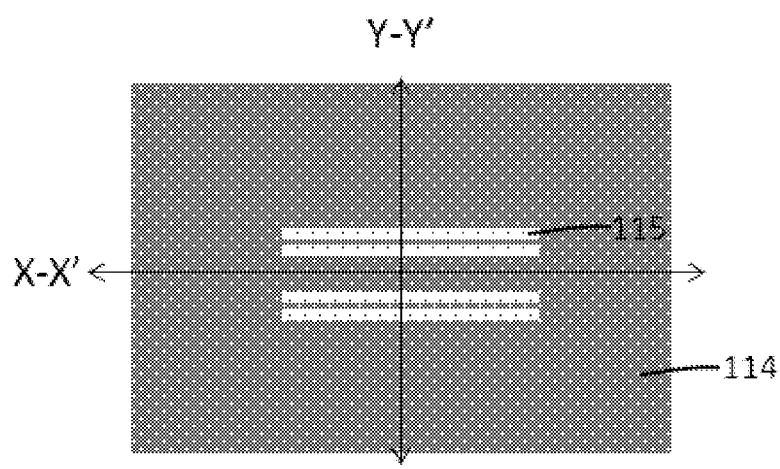
Figure 14B:
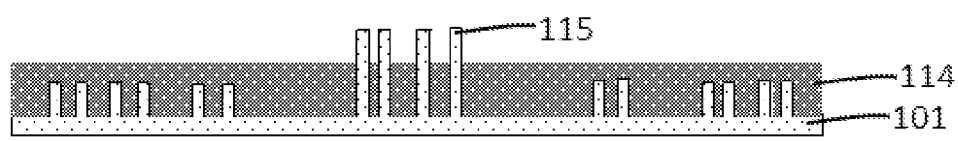

In S14, referring to FIG. 14a and FIG. 14b, the fin hard mask layer 102 and the pad oxide layer 107 on the patterns 113 are removed, and then part of the oxide layer 114 is removed to expose the patterns 113 to form fins 115.

Figure 14C:

Continue referring to FIG. 14c, which is a schematic cross sectional view of the structure cut along the line X-X' in FIG. 14a in the process of forming the fins.

Specifically, the oxide layer 114 at the bottoms of the fins 115 forms isolating parts between the type-one fins 115.

Specifically, the thickness of the remaining oxide layer 114 in S14 is greater than the height of the remaining patterns developed by the photoresist in S9, so the remaining patterns are buried inside the oxide layer 114.

As described above, after the second sidewalls are formed, the at least one second sidewall adjacent to the two sides of the type-one second sidewalls is removed through a fine removal process, such that the at least one second sidewall adjacent to the two sides of the type-one second sidewalls is not transferred to the to-be-patterned layer, thus avoiding the removal of the fins on the two sides of the type-one fins through a fine removal process after the fins are formed, and reducing the difficulty of the fine removal process and the requirement on the fine removal process; after the plurality of patterns on the to-be-patterned layer are formed, the patterns other than the patterns corresponding to the type-one second sidewalls are etched away through a rough removal process, such that the fine removal process and the rough removal process are separately performed, thus reducing the difficulty of the two-step removal process.

Finally, it should be stated that the above embodiments are only used to describe rather than to limit the technical solutions of the present application; although the present application has been described in detail with reference to the above-mentioned embodiments, those skilled in the art should understand that they can still make modifications to the technical solutions recorded in the above-mentioned embodiments, or make equivalent replacements to some or all of the technical features. However, these modifications or replacements do not make the essence of the corresponding technical solution depart from the scope of the technical solution of each embodiment of the present application.

What is claimed is:

1. A method for forming fins of a semiconductor device, comprising a plurality of steps:
    S1: providing a semiconductor substrate, comprising a stack of layers sequentially superimposed, wherein the stack of layers comprises,
    a to-be-patterned layer, a fin hard mask layer, a first mandrel layer and a second mandrel layer, a first etch stop layer being formed between the first mandrel layer and the second mandrel layer, a second etch stop layer being formed between the first mandrel layer and the fin hard mask layer, and a pad oxide layer being formed between the fin hard mask layer and the to-be-patterned layer;
    S2: etching the second mandrel layer to form a plurality of second mandrels with a predetermined spacing therebetween;
    S3: forming first sidewalls on both sides of each of the plurality of second mandrels;
    S4: removing the plurality of second mandrels and keeping the first sidewalls under protection of the first etch stop layer;
    S5: etching the first etch stop layer and the first mandrel layer under protection of the second etch stop layer and the first sidewalls, wherein the first sidewalls pattern a plurality of first mandrels;
    S6: removing the first sidewalls and forming second sidewalls, wherein the second sidewalls cover both sides of each of the plurality first mandrels;

S7: removing the plurality of first mandrels and keeping the second sidewalls;

S8: performing a photolithograph process on the second sidewalls to form a type-one second sidewalls and a type-two second sidewalls, wherein two pairs of the type-one second sidewalls are arranged next to each other and sandwiched between a pair of the type-two second sidewalls on one side and another pair of the type-two second sidewalls on another side, followed by an etching process to remove the pairs of the type-two second sidewalls from both sides the type-one second sidewall;

S9: removing photoresist left by the photolithography process in S8;

S10: performing an etching process to expose the to-be-patterned layer to form patterns on the to-be-patterned layer under protection of remaining type-two second sidewalls and type-one second sidewalls;

S11: removing the remaining type-two and type-one second sidewalls, performing a photolithography process on the to-be-patterned layer to protect a first part of said patterns corresponding to the type-one second sidewalls but not protect a second part of said patterns corresponding to the type-two second sidewalls, followed by an etching process to remove the second etch stop layer, the fin hard mask layer, the pad oxide layer and the second part of said patterns;

S12: removing photoresist in the photolithography process in S11;

S13: performing an thermal annealing process on an oxide layer disposes on the first part of said patterns and then performing a planarization process above the fin hard mask layer; and S14: removing the fin hard mask layer and the pad oxide layer on the first part of the patterns, and removing a part of the oxide layer to expose the first part of the patterns to form fins.

2. The method for forming the fins of the semiconductor device according to claim 1, wherein in S2, a photolithography pattern is formed above the second mandrel layer, and wherein the first mandrel layer is etched by using the photolithography pattern as a mask to form the plurality of second mandrels.

3. The method for forming the fins of the semiconductor device according to claim 1, wherein in S3, a first sidewall material layer is deposited on the plurality of second mandrels; and wherein the first sidewall material layer is etched back to form the first sidewalls.

4. The method for forming the fins of the semiconductor device according to claim 1, wherein in S6, a second sidewall material layer is deposited on the plurality of first mandrels; and wherein the second sidewall material layer is etched back to form the second sidewalls.

5. The method for forming the fins of the semiconductor device according to claim 1, wherein in S8, two pairs of the type-two second sidewalls on each side of the type-two second sidewalls are removed.

6. The method for forming the fins of the semiconductor device according to claim 1, wherein in S14, the oxide layer at a bottom of the fins forms an isolating layer between two of the fins.

7. The method for forming the fins of the semiconductor device according to claim 1, wherein a thickness of remaining part of the oxide layer in S14 is greater than a height of the patterns developed in S9.

8. The method for forming the fins of the semiconductor device according to claim 1, wherein the to-be-patterned layer comprises one of silicon single crystal, germanium single crystal, and silicon germanium crystal.

9. The method for forming the fins of the semiconductor device according to claim 1, wherein a spacing between any two adjacent ones of the plurality of second mandrels is equal.

10. The method for forming the fins of the semiconductor device according to claim 1, wherein in S10, a wet etching process is performed by using the remaining type-two second sidewalls and the type-one second sidewalls as a mask to form the patterns corresponding to the remaining type-two second sidewalls and the type-one second sidewalls.

* * * * *